(12) United States Patent  (10) Patent No.: US 8,643,053 B2
Beom et al.  (45) Date of Patent: *Feb. 4, 2014

(54) LIGHT EMITTING DEVICE

(71) Applicant: LG Innotek Co., Ltd., Seoul (KR)

(72) Inventors: HeeYoung Beom, Seoul (KR);
SungKyoon Kim, Seoul (KR); MinGyu Na, Seoul (KR); HyunSeoung Ju, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/683,711

(22) Filed: Nov. 21, 2012

(65) Prior Publication Data

US 2013/0082299 A1 Apr. 4, 2013

Related U.S. Application Data

(63) Continuation of application No. 13/242,402, filed on Sep. 23, 2011, now Pat. No. 8,319,233.

(30) Foreign Application Priority Data

Dec. 10, 2010 (KR) .................. 10-2010-0126126

(51) Int. Cl.
*H01L 33/00* (2010.01)

(52) U.S. Cl.
USPC ...... 257/99; 257/773; 257/781; 257/E33.062; 257/E25.019; 438/23; 372/46.01

(58) Field of Classification Search
USPC ......... 257/13, 79, 81, 82, 88, 91, 94, 99, 734, 257/745, 773, 778, 781, E33.062, E25.019; 438/22, 23, 950; 372/46.01
See application file for complete search history.

(56) References Cited

U.S. PATENT DOCUMENTS

2004/0232454 A1* 11/2004 Uemura et al. ................ 257/222
2008/0142821 A1* 6/2008 Sakamoto et al. .............. 257/98
2008/0185606 A1* 8/2008 Sano et al. ...................... 257/98

* cited by examiner

*Primary Examiner* — William D Coleman
*Assistant Examiner* — Su Kim
(74) *Attorney, Agent, or Firm* — Lowe Hauptman & Ham LLP

(57) ABSTRACT

Disclosed is a light emitting device including a substrate, a light emitting structure arranged on the substrate, the light emitting structure including a first semiconductor layer, a second semiconductor layer and an active layer arranged between the first semiconductor layer and the second semiconductor layer, a first electrode electrically connected to the first semiconductor layer, and a second electrode electrically connected to the second semiconductor layer, wherein the light emitting structure has a top surface including a first side and a second side which face each other, and a third side and a fourth side which face each other.

18 Claims, 9 Drawing Sheets

| | Comparative Example | Example 1 | Example 2 |
|---|---|---|---|
| Design | | | |
| VF[V] | 3.18 | 3.11 | 3.10 |
| PO[mW] | 18.65 | 19.21 | 19.24 |
| ΛPo | 100.00% | 103.00% | 103.16% |

LIGHT EMITTING DEVICE

CROSS-REFERENCE TO RELATED APPLICATION

This application is a Continuation of patent application Ser. No. 13/242,402, filed on Nov. 27, 2012, which claims priority of Korean Patent Application No. 10-2010-0126126, filed on in Korea Dec. 10, 2010, the disclosure of which is incorporated herein by reference.

BACKGROUND OF THE EMBODIMENT

1. Field

This relates to a light emitting device.

2. Background

Fluorescent lamps go against the trend towards environmental friendliness-oriented next generation lighting systems due to frequent replacement caused by black spots, short lifespan or the like and use of phosphor materials and alternative light sources are thus gradually used instead of fluorescent lamps.

Light emitting diodes (LEDs) attract the most attention as such other light source. LEDs are interesting as next generation light sources owing to semiconductor advantages including rapid processing speed and low power consumption, as well as environmental friendliness and excellent energy saving effects. Accordingly, application of LEDs as alternatives to conventional fluorescent lamps is actively conducted.

Recently, semiconductor light emitting devices such as LEDs are applied to a variety of displays including televisions, monitors, notebook computers, cellular phones and displays and, in particular, are widely used as backlight units instead of conventional CCFLs.

At present, there is a need for high brightness in order to use light emitting devices as light sources. In an attempt to realize high brightness, research associated with manufacture of light emitting devices to uniformly diffuse current and thereby increase luminous efficacy is underway.

BRIEF DESCRIPTION OF THE DRAWINGS

The embodiments will be described in detail with reference to the following drawings in which like reference numerals refer to like elements wherein.

DETAILED DESCRIPTION

Figure 1:
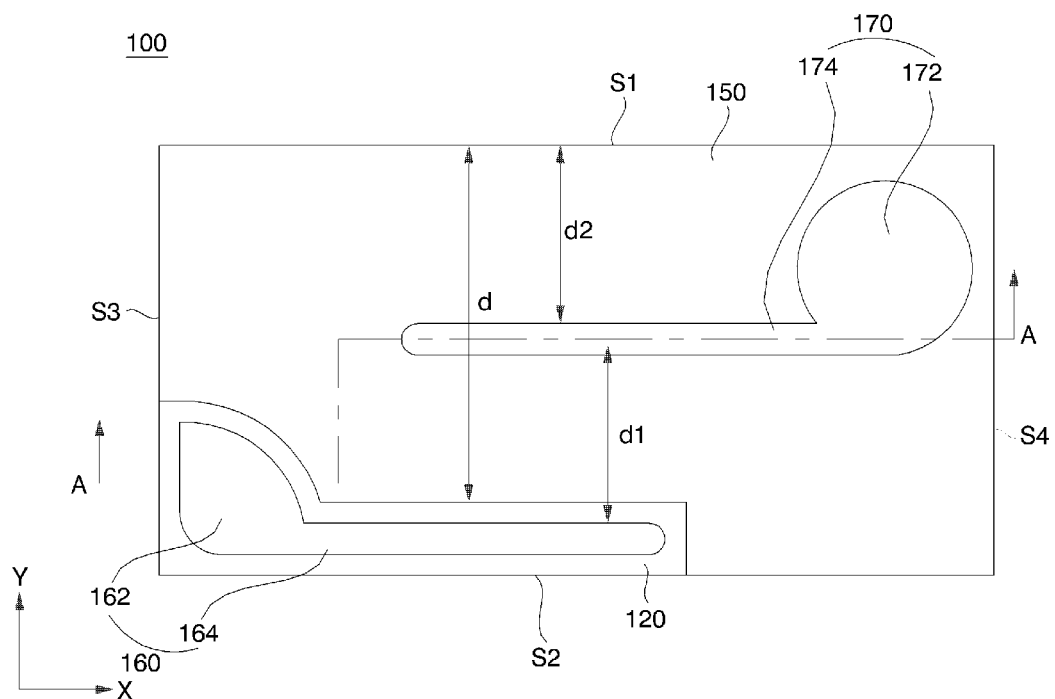
FIG. 1 is a plan view illustrating a light emitting device in accordance with an embodiment as broadly described herein.

Reference will now be made in detail to the preferred embodiments, examples of which are illustrated in the accompanying drawings.

Advantages and characteristics and methods for addressing the same will be clearly understood from the following embodiments taken in conjunction with the annexed drawings. However, embodiments are not limited and may be realized in other various forms. The embodiments are only provided to more completely illustrate and to render a person having ordinary skill in the art to fully understand the scope. The scope is defined only by the claims. Accordingly, in some embodiments, well-known processes, well-known device structures and well-known techniques are not illustrated in detail to avoid unclear interpretation. The same reference numbers will be used throughout the specification to refer to the same or like parts.

Spatially relative terms, "below", "beneath", "lower", "above", "upper" and the like may be used to indicate the relationship between one device or constituent elements and other devices or constituent elements, as shown in the drawings. It should be understood that the spatially relative terms include the direction illustrated in the drawings as well as other directions of devices during use or operation. For example, in a case in which the device shown in the drawing is reversed, a device arranged "below" or "beneath" the other device may be arranged "above" the other device. Accordingly, the exemplary term, "beneath" may include "below" or "beneath" and "above". The device may be arranged in other directions. As a result, the spatially relative terms may be construed depending on orientation.

Terms used in the specification are only provided to illustrate the embodiments and should not be construed as limiting the scope and spirit of the present invention. In the specification, a singular form of terms includes plural forms thereof, unless specifically mentioned otherwise. In the term "comprises" and/or "comprising" as used herein, the mentioned component, step, operation and/or device is not excluded from presence or addition of one or more other components, steps, operations and/or devices.

Unless defined otherwise, all terms (including technical and scientific terms) used herein may be intended to have meanings understood by those skilled in the art. In addition, terms defined in general dictionaries should not be interpreted abnormally or exaggeratedly, unless clearly specifically defined.

In the drawings, the thicknesses or sizes of respective layers are exaggerated, omitted or schematically illustrated for clarity and convenience of description. Therefore, the sizes of respective elements do not wholly reflect actual sizes thereof.

In addition, angles and directions referred to during description of a structure of a light emitting device are described based on illustration in the drawings. In the description of the structure of the light emitting device, if reference points with respect to the angles and positional relations are not clearly stated, the related drawing will be referred to.

Hereinafter, for further detailed illustration of the shape of the light emitting device according to embodiments, the light emitting device will be described based on a first direction (X) and a second direction (Y) vertical to the first direction (X).

Figure 2:
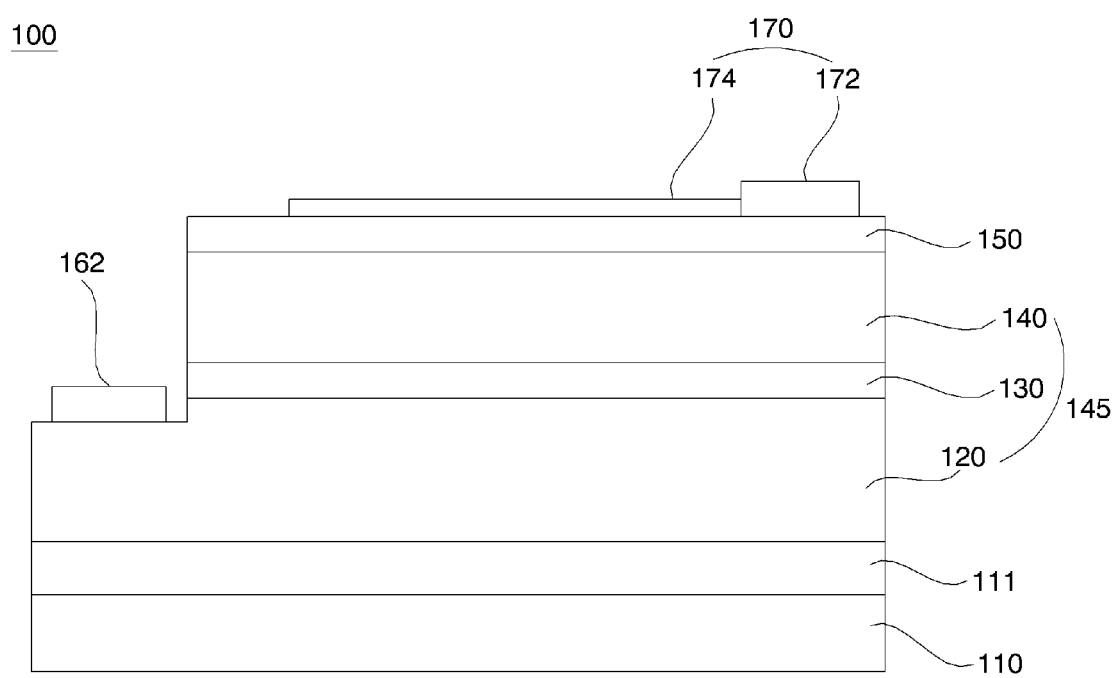
FIG. 2 is a cross-sectional view taken the line A-A of the light emitting device shown in FIG. 1.
Figures 3, 4:
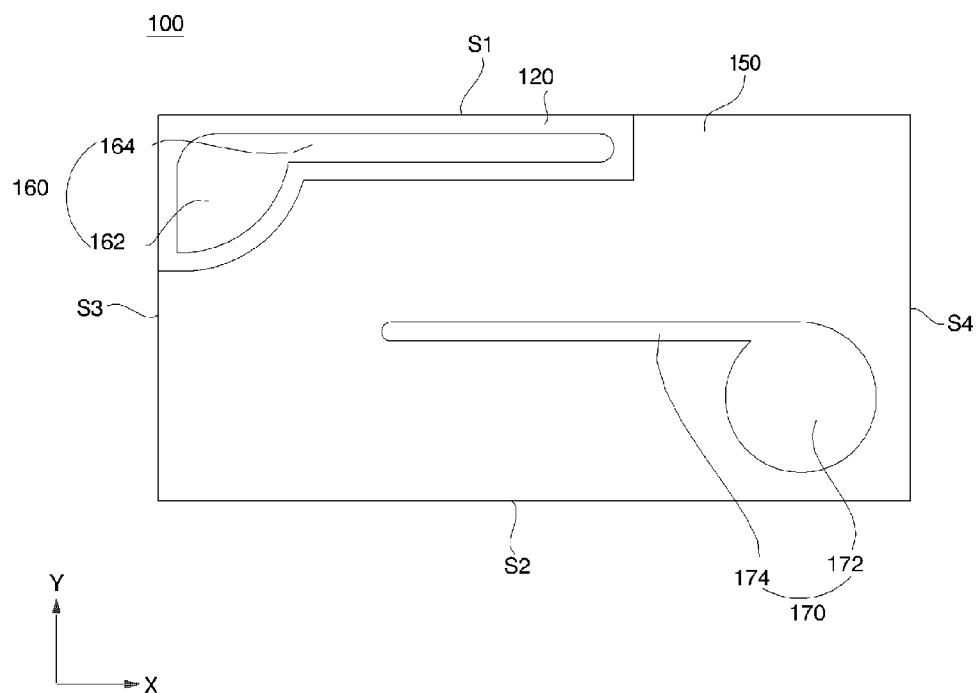
FIG. 3 shows test data of luminous efficacy of the light emitting device shown in FIG. 1.
FIG. 4 is a plan view illustrating a light emitting device in accordance with another embodiment as broadly described herein.

FIG. 1 is a plan view illustrating a light emitting device in accordance with an embodiment as broadly described herein, FIG. 2 is a cross-sectional view taken the line A-A of the light emitting device shown in FIG. 1, and FIG. 3 shows test data of luminous efficacy of the light emitting device shown in FIG. 1.

With reference to FIGS. 1 and 2, a light emitting device 110 as embodied and broadly described herein may include a substrate 110, a light emitting structure 145 including a first semiconductor layer 120, a second semiconductor layer 140 and an active layer 130 arranged between the first semiconductor layer 120 and the second semiconductor layer 140, a first electrode 160 arranged on the first semiconductor layer 120 and a second electrode 170 arranged on the second semiconductor layer 140.

The substrate 110 is a substrate which is suitable for growing semiconductor single crystals and is, for example, made of a light-transmitting material containing sapphire ($Al_2O_3$), and the material may be at least one of Si, GaAs, Si, GaP, InP, Ge, $Ga_2O_3$, ZnO, GaN, SiC and AlN, without being limited thereto.

Impurities present on the surface of the substrate 110 may be removed by wet-washing and the substrate 110 may be a patterned substrate (PSS), the surface of which is patterned with a light extraction pattern to improve light extraction efficiency, but is not limited thereto.

In addition, the substrate 110 may be a material which facilitates emission of heat and thereby improves thermal stability.

Meanwhile, an anti-reflective layer (not shown) may be arranged on the substrate 110 and the anti-reflective layer is commonly called an "AR coating layer", which basically utilizes interference between light reflected from a plurality of interfaces. That is, the AR coating layer renders the status of light reflected from different interfaces to be tilted at an angle of 180 degrees, offsets the light, and reduces strength of the reflected light, although it is not limited thereto.

In addition, a buffer layer 111 may be arranged on the substrate 110 to reduce lattice mismatch between the substrate 110 and the light emitting structure 145 and facilitate growth of a plurality of semiconductor layers.

The buffer layer 111 may be grown in the form of a single crystal on the substrate 110 and the buffer layer 111 grown as the single crystal may improve crystallinity of the light emitting structure 145 grown on the buffer layer 111.

In addition, the buffer layer 111 may be formed at a low temperature and for example may contain at least one of GaN, InN, AlN, AlInN, InGaN, AlGaN, and InAlGaN, although the material for the buffer layer 111 is not limited thereto.

That is, the buffer layer 111 may have an AlInN/GaN laminate structure, an InGaN/GaN laminate structure, or an AlInGaN/InGaN/GaN laminate structure or the like.

The first semiconductor layer 120 may be arranged on the substrate 110 or the buffer layer 111. When the first semiconductor layer 120 is realized as an n-type semiconductor layer, the first semiconductor layer 120 may be selected from semiconductor materials having a formula of $In_xAl_yGa_{1-x-y}N$ ($0 \leq x \leq 1$, $0 \leq y \leq 1$, $0 \leq x+y \leq 1$), such as GaN, AlN, AlGaN, InGaN, InN, InAlGaN, AlInN and may be doped with an n-type dopant such as Si, Ge, Sn, Se and Te.

At this time, an undoped semiconductor layer (not shown) which is not doped with a dopant may be arranged between the first semiconductor layer 120 and the buffer layer 111, the undoped semiconductor layer is formed to improve crystallinity of the first semiconductor layer 120 and may be the same as the first semiconductor layer 120 except that the undoped semiconductor layer exhibits lower electrical conductivity than the first semiconductor layer 120 since it is not doped with an n-type dopant, although it is not limited thereto.

An active layer 130 may be arranged on the first semiconductor layer 120 and the active layer 130 may have a mono- or multi-quantum well structure, a quantum-wire structure, or a quantum dot structure or the like, composed of a compound semiconductor material of Group III-V elements.

In the case where the active layer 152 has a quantum well structure, for example, it may have a mono- or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be made of a material having a band gap smaller than that of the barrier layer.

In addition, a conductive clad layer (not shown) may be arranged on or/and under the active layer 130 and the conductive clad layer may be made of an AlGaN-based semiconductor and may have a band gap larger than that of the active layer 130.

A second semiconductor layer 140 may be arranged on the active layer 130 and may be realized with a p-type semiconductor layer. In a case in which the second semiconductor layer 140 is realized with a p-type semiconductor layer, the second conductive semiconductor layer 140 may for example be made of a semiconductor material having a formula of InxAlyGa1-x-yN ($0 \leq x \leq 1$, $0 \leq y \leq 1$, $0 \leq x+y \leq 1$) such as GaN, AlN, AlGaN, InGaN, InN, InAlGaN and AlInN and may be doped with a p-type dopant such as Mg, Zn, Ca, Sr and Ba.

The first semiconductor layer 120, the active layer 130 and the second semiconductor layer 140 may be formed by a method which includes, but is not limited to, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) or the like.

In addition, the concentrations of n-type and p-type dopants doped in the first semiconductor layer 120 and the second semiconductor layer 140 may be uniform or non-uniform. That is, the structure of a plurality of semiconductor layers may be varied and is not limited.

In addition, unlike those mentioned above, the first semiconductor layer 120 may include a p-type semiconductor layer and the second semiconductor layer 140 may include an n-type semiconductor layer. Accordingly, the light emitting structure 145 may have at least one of n-p, p-n, n-p-n and p-n-p junction structures.

That is, the light emitting structure 145 may have a structure in which the position of the first and second semiconductor layers 120 and 140 arranged based on the active layer 130 is switched, but in the following description, the first semiconductor layer 120 includes an n-type semiconductor layer and is arranged on the substrate 110.

Here, the light emitting structure 145 may have a top surface including first and second sides S1 and S2 which face each other, and third and fourth sides S3 and S4 which face each other and cross the first and second sides S1 and S2, respectively.

That is, when seen from the top of the light emitting structure 145, the first and second sides S1 and S2 may face each other, and the third and fourth sides S3 and S4 may face each other.

In addition, although the first side S1 is arranged in an upper part and the second side S2 is arranged in a lower part in the drawing, the arrangement is not limited thereto. That is, the first side S1 may be arranged in a lower part and the second side S2 may be arranged in an upper part.

In addition, although the third side S3 is arranged in a left part and the fourth side S4 is arranged in a right part in the drawing, the arrangement is not limited thereto. That is, the position of the third side S3 and the fourth side S4 may be switched.

The first to fourth sides S1 to S4 is set based on the position seen from the top of the light emitting structure 145.

The first electrode 160 may be electrically connected to the first semiconductor layer 120. The first electrode 160 may be formed on the first semiconductor layer 120 and may include a first electrode pad 162 and a first electrode arm 164.

In addition, the first electrode 160 may be formed in the exposed part of the first semiconductor layer 120. That is, in the light emitting structure 145, the first semiconductor layer 120 may be exposed by etching a part of the second semiconductor layer 140 and the active layer 130 of the light emitting structure 145 which corresponds to a region where the first electrode 160 is to be arranged using a predetermined etching method, and the first electrode 160 may be arranged on the exposed region of the first semiconductor layer 120.

The first electrode 160 comes into ohmic-contact with the semiconductor layer to facilitate supply of power to the light emitting structure 145. A metal and a light-transmitting conductive layer may be optionally used. The first electrode 160 may include a conductive material. For example, the material includes at least one of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), indium zinc oxide (IZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IrOx, RuOx, RuOx/ITO, Ni/IrOx/Au, and Ni/IrOx/Au/ITO, or an alloy thereof, but is not limited thereto.

The first electrode pad 162 may be formed on one side of the exposed part of the first semiconductor layer 120. The position of the first electrode pad 162 is not limited and for example the first electrode pad 162 may be adjacent to the edge of the second side S2 and the third side S3.

In addition, the shape of the first electrode pad 162 is not limited and may be selected from a variety of shapes including a circle, a rectangle and a semi-circle in view of convenience such as wire bonding.

In FIG. 2, the first electrode pad 162 has a ¼ circle shape, but is not limited thereto.

In addition, the first electrode pad 162 may be provided with a round region adjacent to the edge between the second side S2 and the third side S3 to prevent breakage.

The first electrode arm 164 is connected to the first electrode pad 162 and extends in a first direction (X).

In addition, the position of the first electrode arm 164 is not limited and may be adjacent to the second side S2 of the light emitting structure 145.

The second electrode 170 may be electrically connected to the second semiconductor layer 140. The second electrode 170 includes a second electrode pad 172 and a second electrode arm 174 arranged on the second semiconductor layer 140.

Here, the first electrode arm 164 and the second electrode arm 174 have identical lengths and one thereof may be greater, but is not limited thereto.

In addition, a light-transmitting electrode layer 150 may be formed on the second semiconductor layer 140. At this time, the second electrode 170 may be arranged on the light-transmitting electrode layer 150.

The light-transmitting electrode layer 150 is formed through the entirety or on part of the outer side of the second semiconductor layer 140 to prevent current crowding and discharge light emitted from the active layer 130 to the outside.

That is, the light-transmitting electrode layer 150 for example contains at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but is not limited thereto.

Here, a pattern (not shown) may be formed on the light-transmitting electrode layer 150 and the pattern may be one of a dot pattern, a roughness pattern and a lattice pattern.

That is, the pattern can improve light extraction efficiency and prevent a current crowding phenomenon.

In addition, a current blocking layer (not shown) may be arranged between the light-transmitting electrode layer 150 and the second electrode 170, or between the light-transmitting electrode layer 150 and the second semiconductor layer 140, or inside the light-transmitting electrode layer 150, and the current blocking layer may at least partially overlap the second electrode 170.

The second electrode 170 supplies power to the light emitting structure 145 and is made of the same material as the first electrode 160.

The second electrode pad 172 may be formed on the second semiconductor layer 140 at the other side of the first electrode pad 162.

That is, the second electrode pad 172 may be formed adjacent to the fourth side S4 on the second semiconductor layer 140. In addition, the position of the second electrode pad 172 is not limited and, for example, the second electrode pad 172 may be arranged adjacent to the edge between the first side S1 and the fourth side S4 in view of current diffusion efficiency and luminous efficacy.

The shape of the second electrode pad 172 is not limited and may be selected from a variety of shapes including, but not being limited to, a circle, a rectangle and a semi-circle in view of convenient connection to a power source by wire bonding.

The second electrode arm 174 is connected to the second electrode pad 172 and extends in an opposite direction to the first direction (X).

With reference to FIG. 2, the second electrode arm 174 forms a step with the second electrode pad 172, which is provided as one embodiment, but is not limited thereto.

In addition, the distance d1 from the first electrode arm 164 to the second electrode arm 174 in a second direction Y may be within a range of 25% to 75% of the width d of the second semiconductor layer 140 in the second direction Y.

Here, the width d of the second semiconductor layer 140 means a distance between both sides in the second direction Y of the light emitting device of the second semiconductor layer 140, excluding the etched region of the second semiconductor layer 140.

The distance d1 between the first electrode arm 164 and the second electrode arm 174 is 25% to 75% of the width d of the second semiconductor layer 140 in the second direction Y to remove current crowding of the light emitting device.

And, the distance d2 between the first side of the second semiconductor layer 140 and the second electrode arm 174 is 25% to 50% of the width or the second semiconductor layer 140.

That is, the distance d1 between the first electrode arm 164 and the second electrode arm 174 and the between the first side of the second semiconductor layer 140 and the second electrode arm 174 causes improvement in current diffusion efficiency of the light emitting device and a decrease in drive voltage, thus leading to improvement in current diffusion efficiency of the light emitting device, improvement in internal quantum efficiency and an increase in light extraction efficiency.

Here, With reference to FIG. 3, the light emitting device 100 of Example 2 exhibits a decrease of 0.08V in drive voltage (VF), as compared to Comparative Example and a 3.16% increase in luminous efficacy, as compared to Comparative Example. The 3% or more increase in luminous efficacy is a considerable increase which approaches theoretical limits of luminous efficacy and in particular, 3% or more of an increase in luminous efficacy in small chips demonstrates applicability to small chips.

In addition, comparing Example 1 and Example 2, and Comparative Example, the second electrode arm 174 readily diffuses current, luminous efficacy is improved and drive voltage is reduced, as it reaches the center of the second semiconductor current diffusion layer 140.

In addition, as drive voltage decreases, heat generation can be reduced during use of the light emitting device 100.

The second electrode arm 174 may be formed in the center of the width of the second semiconductor layer 140 in the second direction Y.

That is, the second electrode arm 174 is arranged in the center of the width of the second semiconductor layer 140 in the second direction Y, and the light emitting device may extend in an opposite direction to the first direction X.

Accordingly, when the first electrode arm 164 is adjacent to the second side S2, the distance d1 from the first electrode arm 164 to the second electrode arm 174 in the second direction Y is within a range of 25% to 75% of the width Y of the width of the second semiconductor layer 140 in the second direction Y.

In addition, the second electrode arm 174 may be connected to a lower part of the width d of the second electrode pad 172 in the second direction Y, but is not limited thereto.

In addition, the first electrode arm 164 and the second electrode arm 174 may extend in the first direction X and in the opposite direction thereto.

In addition, the first electrode arm 164 and the second electrode arm 174 may be arranged in parallel. When the first electrode arm 164 and the second electrode arm 174 are parallel to each other in the first direction X, diffusion of current between the first electrode arm 164 and the second electrode arm 174 is facilitated, drive voltage decreases and luminous efficacy is improved.

FIG. 4 is a plan view illustrating a light emitting device in accordance with another embodiment as broadly described herein.

The light emitting device 100 shown in FIG. 4 has the same configuration as the light emitting device 100 shown in FIG. 1. The light emitting device 100 shown in FIG. 4 has a configuration in which the top and the bottom thereof are reversed to those of the light emitting device 100 shown in FIG. 1. At this time, the positions of the first to fourth sides (S1 to S4) and the positions of first and second electrodes 160 and 170 are relative. That is, when the position of one is varied, the other may be relatively varied.

Figure 5:
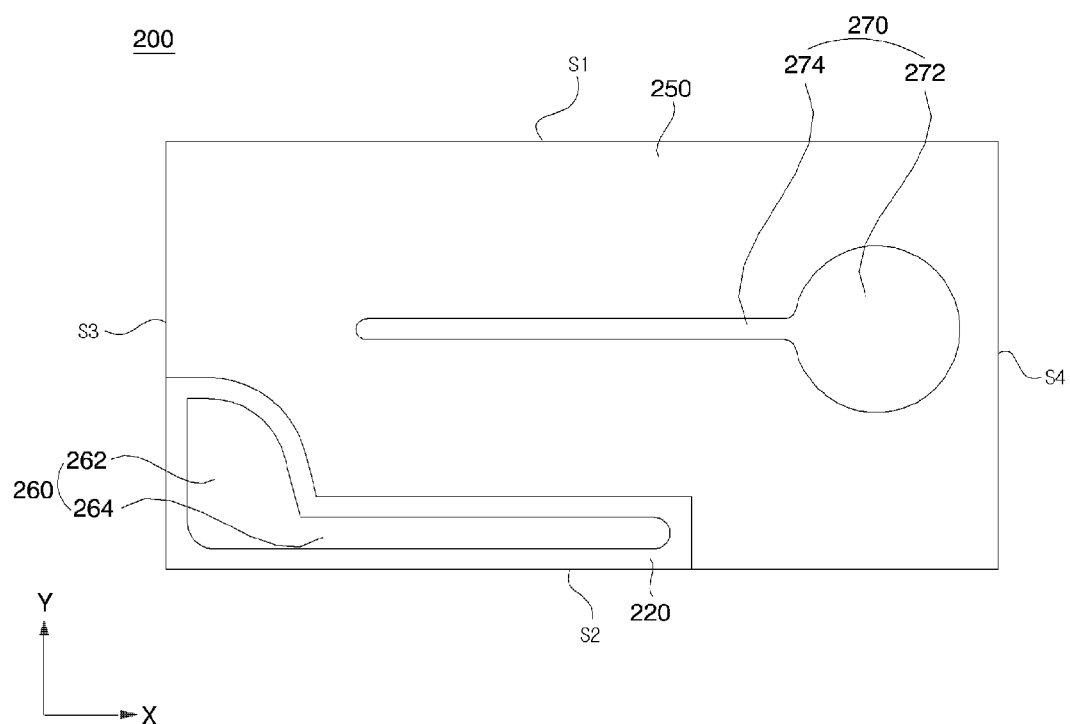
FIG. 5 is a plan view illustrating a light emitting device in accordance with other embodiment as broadly described herein.

FIG. 5 is a plan view illustrating a light emitting device in accordance with other embodiment as broadly described herein.

Referring to FIG. 5, the configuration of the light emitting device 200 shown in FIG. 1 may differ from that of the light emitting device 100 in view of the position of the second electrode pad 272.

In addition, the light emitting device 200 of FIG. 5 includes the same elements as the light emitting device 100 of FIG. 1 and a description thereof is thus omitted.

The second electrode pad 272 may be formed in the center of the width of the second semiconductor layer 240 in the second direction Y. That is, when, like the second electrode arm 274, the second electrode pad 272 is formed in the center of the width of the second semiconductor layer 240 in the second direction Y, light extraction efficiency of the light emitting device can be further improved.

The position of the second electrode arm 274 connected to the second electrode pad 272 may be freely determined taking into consideration the luminous efficacy and current diffusion efficiency of the light emitting device.

The second electrode arm 274 may be connected to the top, center or the bottom of the width of the second electrode pad 272 in the second direction Y. That is, the second electrode arm 274 may be connected to any part of the width of the second electrode pad 272 in the second direction Y.

Figure 6:
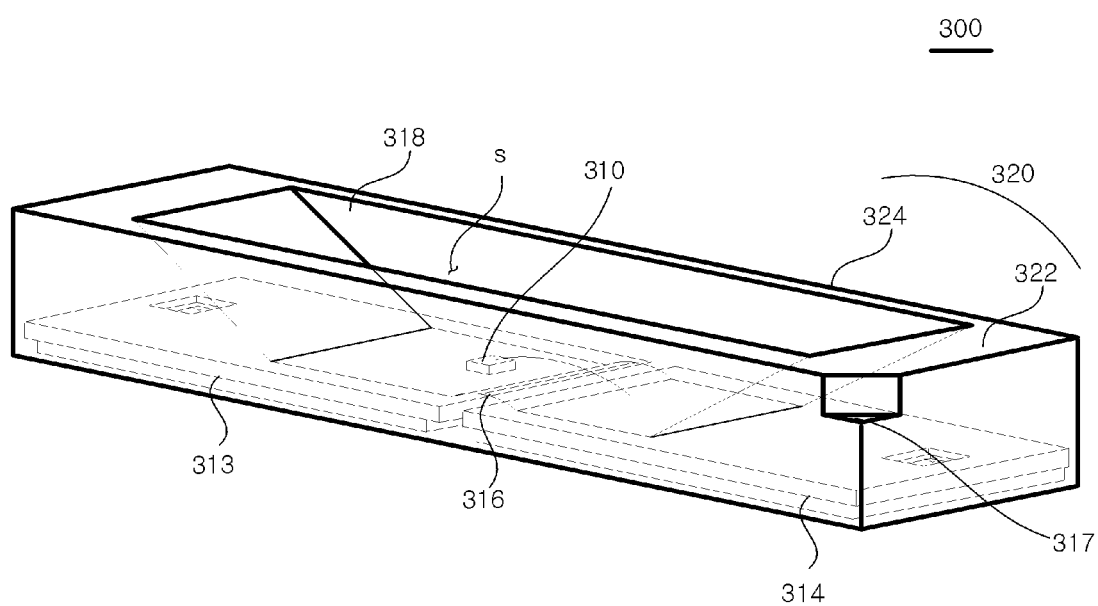
FIG. 6 is a perspective view of a light emitting device package including the light emitting device in accordance embodiments as broadly described herein.

FIG. 6 is a perspective view of a light emitting device package including the light emitting device in accordance embodiments as broadly described herein.

FIG. 6 is a perspective view to see through one part of the light emitting device package 300. Although the light emitting device package 300 is a top view in this embodiment, the light emitting device package 300 may be a side view and is not limited thereto.

Referring to FIG. 6, the light emitting device package 300 may include a light emitting device 310 and a body 320 in which the light emitting device 310 is arranged.

The body 320 may include a first barrier rib 322 arranged in a first direction (not shown) and a second barrier rib 324 arranged in a second direction (not shown) which crosses the first direction. The first and second barrier ribs 322 and 324 may be integrally formed and may be formed by an extrusion molding, etching or the like and is not limited thereto.

That is, first and second barrier ribs 322 and 324 may be made of at least one selected from resins such as polyphthalamide (PPA), silicon (Si), aluminum (Al), aluminum nitride (AlN), aluminum oxide (AlOx), photosensitive glass (PSG), polyamide 9T (PA9T), syndiotactic polystyrene (SPS), a metal, sapphire (Al2O3), beryllium oxide (BeO), ceramic, and a printed circuit board (PCB).

The top shape of the first and second barrier ribs 322 and 324 may be selected from a variety of shapes including triangle, rectangle, polygon and circle depending on the application and designs of the light emitting device 310, and is not limited thereto.

In addition, the first and second barrier ribs 322 and 324 form a cavity(s) in which the light emitting device 310 is arranged. The cross-section of cavity(s) may have a cup shape, recessed container shape or the like. The first and second barrier ribs 322 and 324 constituting the cavity(s) may have an inclined face in a lower direction.

In addition, the plan surface of cavity(s) may be selected from a variety of shapes including triangle, rectangle, polygon and circle, but is not limited thereto.

First and second lead frames 313 and 314 may be arranged under the body 320. The first lead frame 313 and the second lead frame 314 contain a metal such as titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second lead frames 313 and 314 may have a monolayer or multilayer structure, without being limited thereto.

The inner side of the first and second barrier ribs 322 and 324 may be inclined at a predetermined angle with respect to one of the first and second lead frames 313 and 314. The reflective angle of light emitted from the light emitting device 310 may be varied, depending on the inclination angle. Accordingly, the orientation angle of light discharged to the outside can be controlled. As the orientation angle of light decreases, convergence of light emitted from the light emitting device 310 to the outside increases. On the other hand, as the orientation angle of light increases, convergence of light emitted from the light emitting device 310 to the outside decreases.

The inner side of the body 320 may have a plurality of inclination angles and is not limited thereto.

The first and second lead frames 313 and 314 are electrically connected to the light emitting device 310, are connected to positive (+) and negative (−) electrodes of outer power sources (not shown), respectively, and supply power to the light emitting device 310.

In this embodiment, the light emitting device 310 is arranged on the first lead frame 313, the second lead frame 314 is spaced from the first lead frame 313, and the light emitting device 310 is die-bonded to the first lead frame 313 and is wire-bonded to the second lead frame 314 through a wire (not shown) to receive power from the first and second lead frames 313 and 314.

Here, the light emitting device 310 may be bonded to the first lead frame 313 and the second lead frame 314, which have different polarities.

In addition, the light emitting device 310 is wire-bonded or die-bonded to the first and second lead frames 313 and 314, without being limited in terms of connection formation method.

The light emitting device 310 is arranged in the first lead frame 313 in this embodiment, but is not limited thereto.

In addition, the light emitting device 310 may be adhered to the first lead frame 313 through an adhesive member (not shown).

Here, an insulating dam 316 may be formed between the first and second lead frames 313 and 314 to prevent electric short between the first and second lead frames 313 and 314.

In this embodiment, the insulating dam 316 may have a semi-circular top and the shape thereof is not limited thereto.

The body 313 may be provided with a cathode mark 317. The cathode mark 317 divides polarity of the light emitting device 310 (that is, polarity of the first and second lead frames 313 and 314), and may thus be used to prevent confusion when first and second lead frames 313 and 314 are electrically connected.

The light emitting device 310 may be a light emitting diode. The light emitting diode may be a color light emitting diode to emit colored light such as red, green, blue or white light, or an ultraviolet (UV) light emitting diode to emit ultraviolet light, without being limited thereto. The light emitting device 310 mounted on the first lead frame 313 may be present in plural, at least one light emitting device 310 may be mounted on the first and second lead frames 313 and 314, and the number and position of the light emitting device 310 are not limited.

Here, the light emitting device 310 may be one of light emitting devices 100 and 200 shown in FIGS. 1, 4 and 5, but is not limited thereto.

The body 320 may include a resin material 318 filled in the cavity(s). That is, the resin material 318 may have a double-molded structure or a triple-molded structure and is not limited thereto.

In addition, the resin material 318 may be a film type and include at least one of a phosphor and a light diffusion material.

In addition, the resin material 318 may include a light-transmitting material which contains a phosphor and a light diffusion material, but is not limited thereto.

Figure 7:
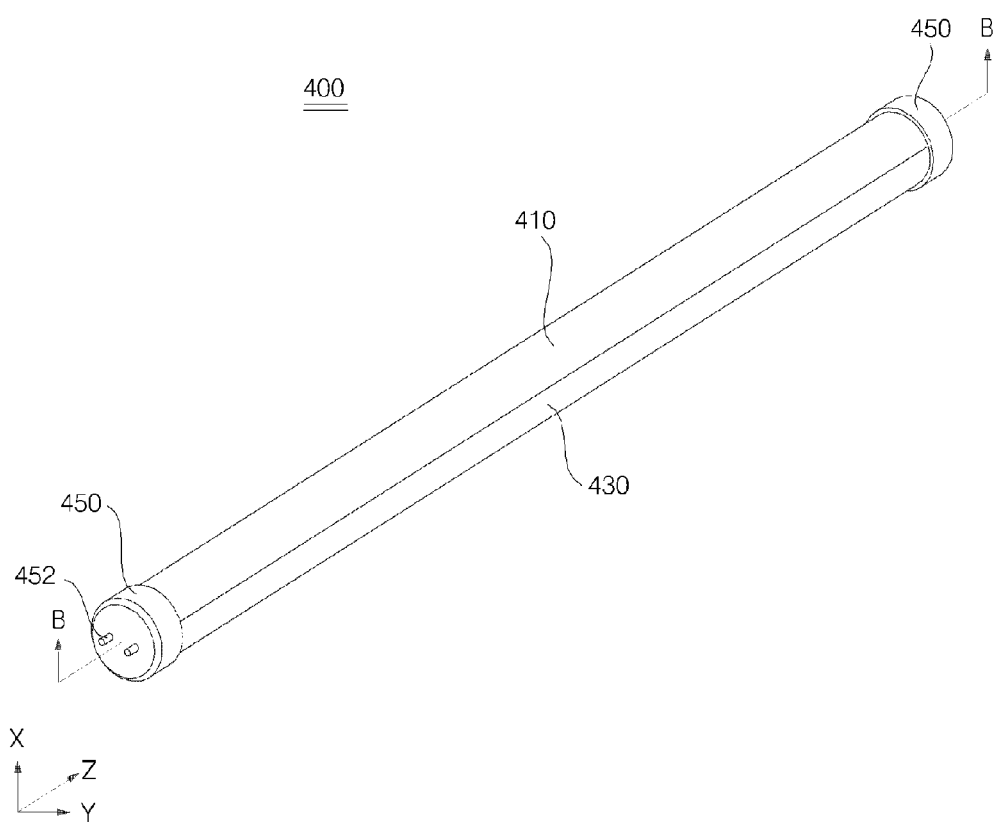
FIG. 7 is a perspective view of a backlight unit including a light emitting device in accordance embodiments as broadly described herein.
Figure 8:
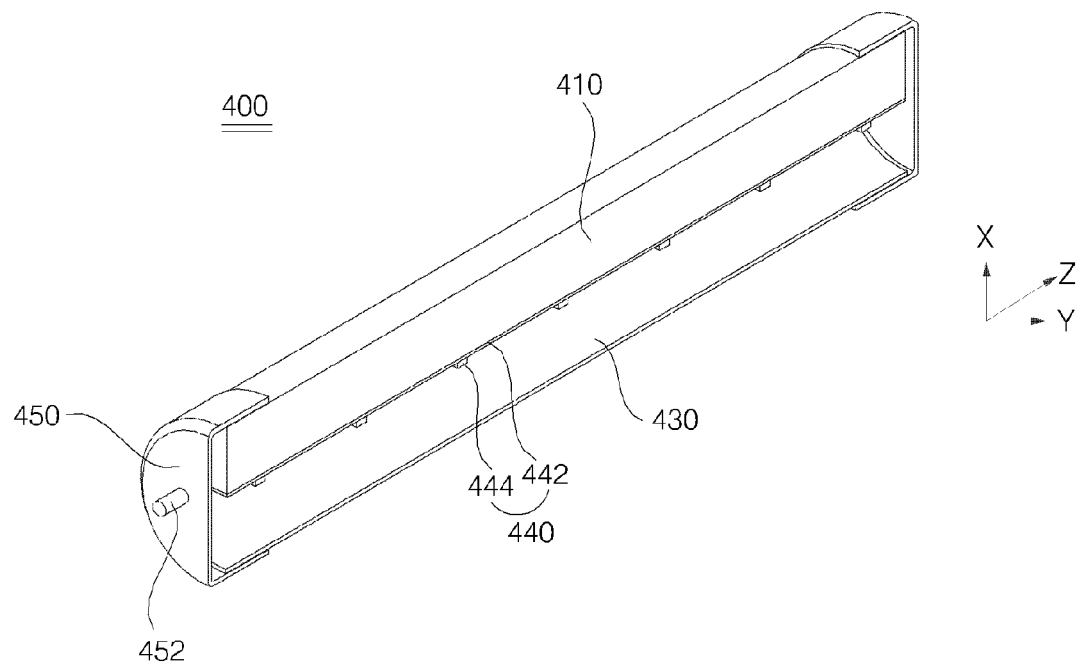
FIG. 8 is a sectional view of the lighting device taken along the line A-A of the lighting device shown in FIG. 7.

FIG. 7 is a perspective view of a backlight unit including a light emitting device in accordance embodiments as broadly described herein, and FIG. 8 is a sectional view of the lighting device taken along the line A-A of the lighting device shown in FIG. 7.

Hereinafter, for better understanding, the lighting device 400 will be described based on a longitudinal direction (Z), a horizontal direction (Y) vertical to the longitudinal direction (Z), and a height direction (X) vertical to the longitudinal direction (Z) and the horizontal direction (Y).

That is, FIG. 8 is a sectional view of the lighting device 400 of FIG. 7, taken along the cross-section of the longitudinal direction (Z) and height direction (X) and seen from the horizontal direction (Y).

Referring to FIGS. 7 and 8, the lighting device 400 may include a body 410, a cover 430 connected to the body 410 and an end cap 450 arranged at both ends of the body 410.

A light emitting device module 440 is connected to the bottom of the body 410 and the body 410 may be composed of a metal which exhibits superior conductivity and excellent heat release effects in order to discharge heat generated from light emitting device packages 444 to the outside through the top of the body 410.

The light emitting device packages 444 exhibit improved bonding reliability and luminous efficacy and are advantageous in designing slim and small display devices due to roughness (not shown) provided in each lead frame (not shown).

The light emitting device packages 444 are mounted in multiple colors and multiple rows on the PCB 442 to form an array and may be spaced from one another by a predetermined distance or by different distances, as necessary, to control brightness. The PCB 442 may be a metal core PCB (MCPCB) or a PCB made of FR4.

The cover 430 may take the shape of a circle to surround the bottom of the body 410, without being limited thereto.

The cover 430 protects the light emitting device module 440 from foreign substances. In addition, the cover 430 prevents glare generated from the light emitting device package 444 and includes diffusion particles to uniformly discharge light to the outside. In addition, a prism pattern or the like may be formed on at least one of the inner and outer surfaces of the cover 430. Alternatively, a phosphor may be applied to at least one of the inner and outer surfaces of the cover 430.

Meanwhile, the cover 430 should exhibit superior light transmittance, so that it can discharge light generated from the light emitting device package 444 through the cover 430 to the outside, and the cover 430 should exhibit sufficient heat resistance so that it can endure heat emitted by the light emitting device package 444. Preferably, the cover 430 is composed of a material including polyethylene terephthalate (PET), polycarbonate (PC), polymethyl methacrylate (PMMA) and the like.

The end cap 450 is arranged on both ends of the body 410 and may be used to seal a power device (not shown). In addition, the end cap 450 is provided with a power pin 452, allowing the lighting device 400 to be applied to a conventional terminal from which fluorescent light has been removed, without using any additional device.

Figure 9:
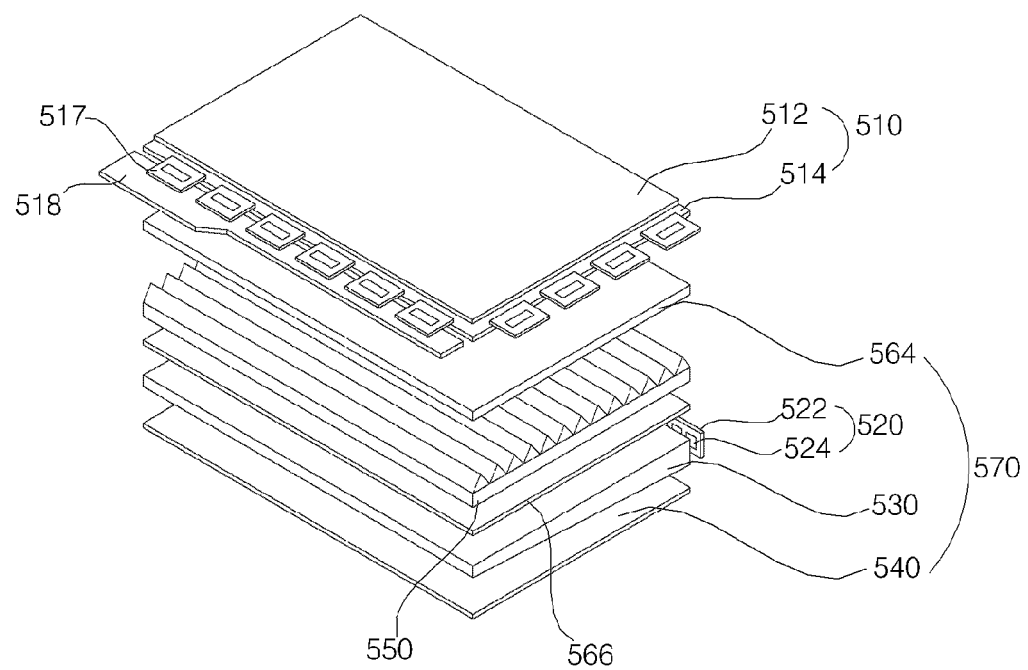
FIG. 9 is a perspective view of a liquid crystal display including a light emitting device in accordance with an embodiment as broadly described herein.

FIG. 9 is a perspective view of a liquid crystal display including a light emitting device in accordance with an embodiment as broadly described herein.

FIG. 9 illustrates an edge-light type liquid crystal display device 500 which includes a liquid crystal display panel 510 and a backlight unit 570 to supply light to the liquid crystal display panel 510.

The liquid crystal display panel 510 displays an image using light supplied from the backlight unit 570. The liquid crystal display panel 510 includes a color filter substrate 512 and a thin film transistor substrate 514 which face each other such that a liquid crystal is interposed therebetween.

The color filter substrate 512 can realize color images to be displayed through the liquid crystal display panel 510.

The thin film transistor substrate 514 is electrically connected to a printed circuit board 518 on which a plurality of circuit components is mounted through a driving film 517. The thin film transistor substrate 514 responds to drive signals supplied from the printed circuit board 518 and may apply drive voltage from the printed circuit board 518 to liquid crystals.

The thin film transistor substrate 514 includes a thin film transistor and a pixel electrode formed as a thin film on other substrates composed of a transparent material such as glass or plastic.

The backlight unit 570 includes a light emitting device module 520 to emit light, a light guide plate 530 to convert light emitted from the light emitting device module 520 into surface light and supply the light to the liquid crystal display panel 510, a plurality of films 550, 566 and 564 to uniformize brightness of light from the light guide plate 530 and improve vertical incidence, and a reflective sheet 540 to reflect light emitted to the back of the light guide plate 530 to the light guide plate 530.

The light emitting device module 520 includes a plurality of light emitting device packages 524 and a PCB 522 on which the light emitting device packages 524 are mounted to form an array.

Meanwhile, the backlight unit 570 includes a diffusion film 566 to diffuse light incident from the light guide plate 530 toward the liquid crystal display panel 510, a prism film 550 to concentrate the diffused light and thus improve vertical incidence and a protective film 564 to protect the prism film 550.

Figure 10:
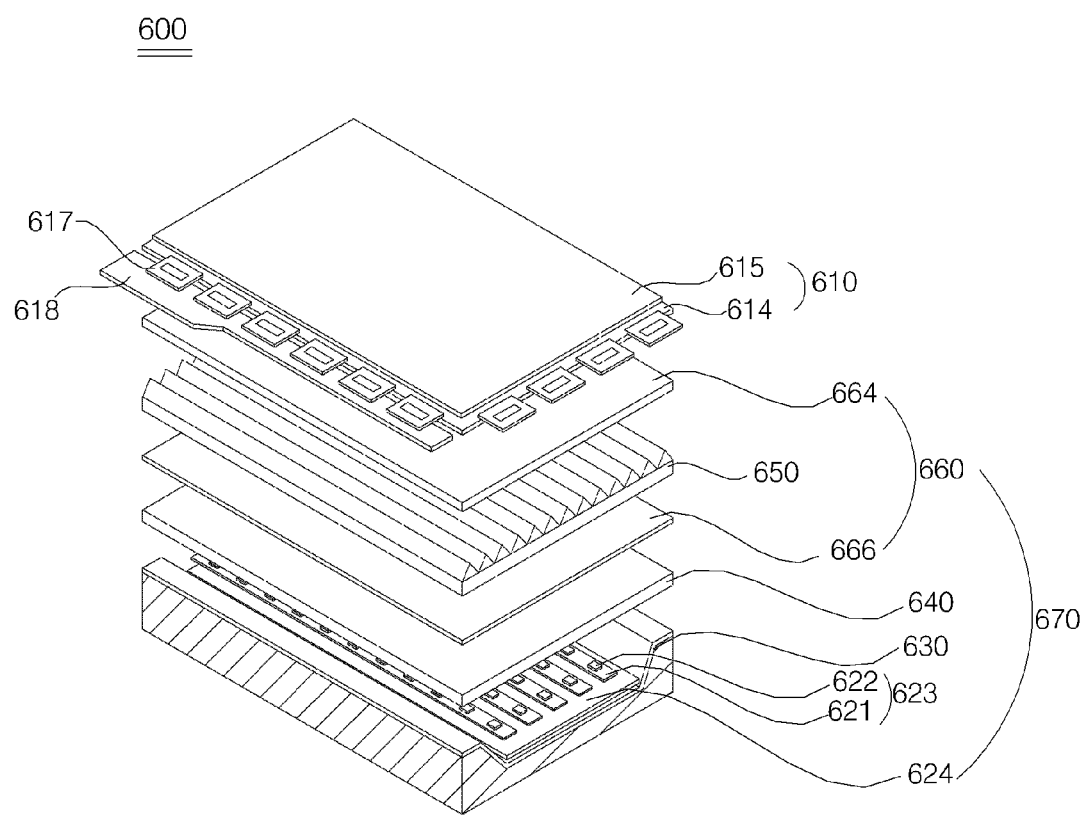
FIG. 10 is a perspective view of a liquid crystal display including a light emitting device in accordance with another embodiment as broadly described herein.

FIG. 10 is a perspective view of a liquid crystal display including a light emitting device in accordance with another embodiment as broadly described herein.

The contents illustrated and described in FIG. 9 are not mentioned in detail.

FIG. 10 illustrates a direct-type liquid crystal display device 600 which includes a liquid crystal display panel 610 and a backlight unit 670 to supply light to the liquid crystal display panel 610.

The liquid crystal display panel 610 has been described in FIG. 9 and a detailed explanation thereof is thus omitted.

The backlight unit 670 includes a plurality of light emitting device modules 623, a reflective sheet 624, a lower chassis 630 in which the light emitting device modules 623 and the reflective sheet 624 are accepted, and a diffusion plate 640 and a plurality of optical films 660 arranged on the light emitting device modules 623.

Each light emitting device module 623 includes a plurality of light emitting device packages and a PCB 621 on which the light emitting device packages 624 are mounted to form an array.

In particular, the light emitting device package 622 exhibits improved bonding reliability and realizes slim and further reliable backlight units 670 due to the roughness 170 formed in a region where the light source unit 130 and a wire 150 are wire-bonded to respective lead frames 140 and 142.

The reflective sheet 624 reflects light generated by the light emitting device package 622 toward the liquid crystal display panel 610 to improve luminous efficacy.

Meanwhile, light emitted from the light emitting device module 623 is incident on the diffusion plate 640 and an optical film 660 is arranged on the diffusion plate 640. The optical film 660 includes a diffusion film 666, a prism film 650 and a protective film 664.

In the embodiments, the lighting device 400 and liquid crystal displays 500 and 600 may be included in the lighting system and a lighting device including a light emitting device package may be included in the lighting system.

A light emitting device as embodied and broadly described herein may allow which exhibits improved luminous efficacy, reduces drive voltage, and improves safety and reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a light emitting structure arranged on the substrate, the light emitting structure including a first semiconductor layer, a second semiconductor layer and an active layer arranged between the first semiconductor layer and the second semiconductor layer;
a first electrode electrically connected to the first semiconductor layer; and
a second electrode electrically connected to the second semiconductor layer,
wherein the light emitting structure has a top surface including a first side and a second side which face each other, and a third side and a fourth side which face each other,
wherein the first electrode includes:
a first electrode pad adjacent to the edge of the second side and the third side in the exposed part of the first semiconductor layer; and
a first electrode arm connected to the first electrode pad, the first electrode arm extending in a first direction,
the second electrode includes:

a second electrode pad adjacent to the fourth side on the second semiconductor layer; and a second electrode arm connected to the second electrode pad, the second electrode arm extending in an opposite direction to the first direction, the distance from the first electrode arm to the second electrode arm in a second direction is 25% to 75% of the width of the second semiconductor layer in the second direction.

2. The light emitting device of claim 1, wherein the second electrode pad is formed adjacent to the edge between the first side and the fourth side.

3. The light emitting device of claim 1, wherein the second electrode pad is formed adjacent to the center of the width of the second semiconductor layer in the second direction.

4. The light emitting device of claim 1, wherein the first electrode arm and the second electrode arm are formed in parallel.

5. The light emitting device of claim 1, wherein at least one of the first and second electrode pads has a circular shape of a shape having a curved part.

6. The light emitting device of claim 1, wherein the first and second electrode pads have different shapes.

7. The light emitting device of claim 1, wherein the lengths of the first and second electrode arms are equivalent or one thereof is greater.

8. The light emitting device of claim 1, wherein the second electrode pad does not overlap the first electrode pad in the first direction.

9. The light emitting device of claim 1, further comprising:
a current blocking layer arranged between a light-transmitting electrode layer and the second electrode, or between a light-transmitting electrode layer and the second semiconductor layer, or inside the light-transmitting electrode layer.

10. The light emitting device of claim 9, wherein the current blocking layer vertically partially overlaps the second electrode.

11. The light emitting device of claim 1, wherein the first electrode is arranged in one part of the first semiconductor layer formed by mesa-etching the active layer and the second semiconductor layer.

12. The light emitting device of claim 1, wherein the second electrode arm is connected to the center of the second electrode pad in the second direction.

13. The light emitting device of claim 1, wherein the second electrode arm is connected to a lower part of the second electrode pad in the second direction.

14. The light emitting device of claim 1, wherein the second electrode arm defines the first and second sides of the top surface of the light emitting structure, the second electrode pad is located at the first side, and the first electrode pad is located at the second side.

15. A light emitting device comprising:
a substrate;
a light emitting structure arranged on the substrate, the light emitting structure including a first semiconductor layer, a second semiconductor layer and an active layer arranged between the first semiconductor layer and the second semiconductor layer;
a first electrode arranged on the first semiconductor layer, the first electrode including a first electrode pad and a first electrode arm extending from the first electrode pad in a first direction; and
a second electrode arranged on the second semiconductor layer, the second electrode including a second electrode pad and a second electrode arm extending parallel to the first electrode arm, wherein a first distance between the first electrode arm and the second electrode arm in a second direction is 25% to 75% of the width of the light emitting structure, a second distance between one side of the second semiconductor layer and the second electrode arm adjacent thereto is 25% to 50% of the width of the second semiconductor layer, and the second electrode arm is connected to a lower part of the second electrode pad in the second direction.

16. The light emitting device of claim 15, wherein the second electrode arm divides a top surface of the light emitting structure into first and second sides opposed to each other in the second direction, the second electrode pad is located at the first side, and the first electrode pad is located at the second side.

17. A light emitting device package comprising:
a light emitting device including a light emitting diode; and
a body including a first lead frame provided with the light emitting device and a second lead frame spaced from the first lead frame, wherein the light emitting device comprises:
a substrate;
a light emitting structure arranged on the substrate, the light emitting structure including a first semiconductor layer, a second semiconductor layer and an active layer arranged between the first semiconductor layer and the second semiconductor layer;
a first electrode arranged on the first semiconductor layer, the first electrode including a first electrode pad electrically connected to the first lead frame and a first electrode arm extending from the first electrode pad in a first direction; and
a second electrode arranged on the second semiconductor layer, the second electrode including an second electrode pad between the center of the second semiconductor layer and the one side of the second semiconductor layer, and a second electrode arm extending parallel to the first electrode pad, wherein a first distance between the first electrode arm and the second electrode arm in a second direction is 25% to 75% of the width of the light emitting structure, and a second distance between the one side of the second semiconductor layer and the second electrode arm adjacent thereto is 25% to 50% of the width of the second semiconductor layer, and the second electrode arm is connected to a lower part of the second electrode pad in the second direction.

18. The light emitting device of claim 17, wherein the second electrode arm divides a top surface of the light emitting structure into first and second sides opposed to each other in the second direction, the second electrode pad is located at the first side, and the first electrode pad is located at the second side.

* * * * *